United States Patent
Han et al.

(10) Patent No.: US 8,664,780 B2
(45) Date of Patent: Mar. 4, 2014

(54) SEMICONDUCTOR PACKAGE HAVING PLURAL SEMICONDUCTOR CHIPS AND METHOD OF FORMING THE SAME

(75) Inventors: Chang-Hoon Han, Cheonan-si (KR);
Jin-Ho Kim, Cheonan-si (KR);
Bo-Seong Kim, Asan-si (KR); Yun-Jin Oh, Asan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/534,212

(22) Filed: Jun. 27, 2012

(65) Prior Publication Data

US 2013/0049221 A1    Feb. 28, 2013

(30) Foreign Application Priority Data

Aug. 31, 2011    (KR) .................. 10-2011-0088093

(51) Int. Cl.
*H01L 23/29* (2006.01)
*H01L 29/40* (2006.01)

(52) U.S. Cl.
USPC ..... 257/790; 257/778; 257/678; 257/E25.013

(58) Field of Classification Search
USPC .................. 257/778, 678, E25.013, 790
See application file for complete search history.

(56) References Cited

U.S. PATENT DOCUMENTS

| 7,626,253 | B2 | 12/2009 | Onodera et al. | |
| 2004/0119152 | A1 | 6/2004 | Karnezos et al. | |
| 2007/0117266 | A1* | 5/2007 | Ball | 438/108 |
| 2008/0164596 | A1* | 7/2008 | Lim | 257/686 |
| 2010/0181661 | A1* | 7/2010 | Takemoto et al. | 257/686 |
| 2011/0175222 | A1* | 7/2011 | Kim et al. | 257/738 |

FOREIGN PATENT DOCUMENTS

| JP | 2007-324443 | | 12/2007 |
| JP | 2007324443 A | * | 12/2007 |
| JP | 2009-126980 | | 6/2009 |
| KR | 102007008058 A | | 8/2007 |
| KR | 1020070088058 A | | 8/2007 |

* cited by examiner

*Primary Examiner* — Steven Loke
*Assistant Examiner* — Juanita B Rhodes
(74) *Attorney, Agent, or Firm* — Volentine & Whitt, PLLC

(57) ABSTRACT

A semiconductor package includes a first semiconductor chip mounted to a substrate, a first encapsulant covering the first semiconductor chip and have first to fourth sidewall surfaces, and a chip stack mounted to the substrate and disposed on the first encapsulant. The chip stack includes a plurality of second semiconductor chips. A second encapsulant covers the chip stack. The second encapsulant may cover the first sidewall surface of the first encapsulant and expose the third sidewall surface of the first encapsulant.

19 Claims, 16 Drawing Sheets

FIG. 15
FIG. 16
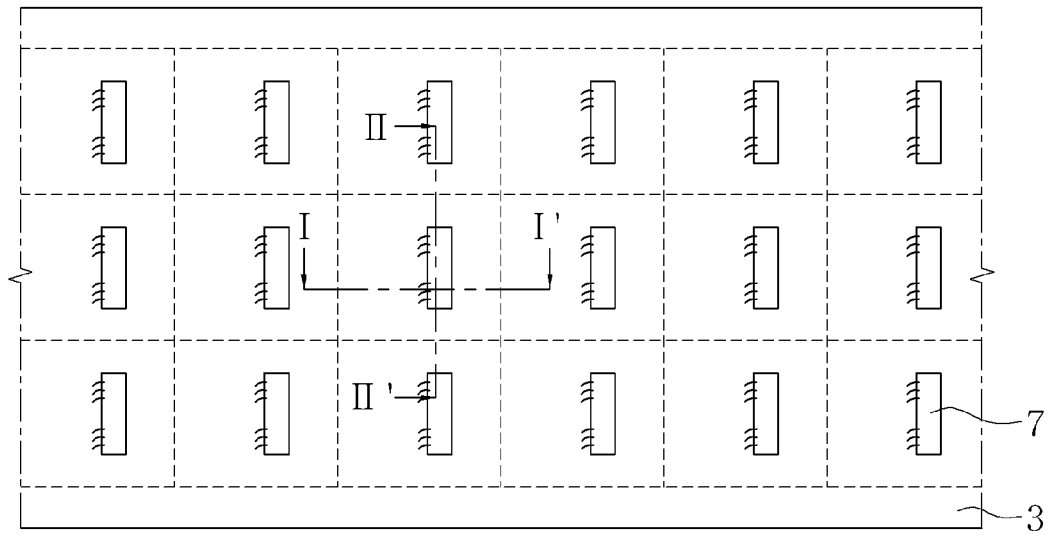
FIG. 17
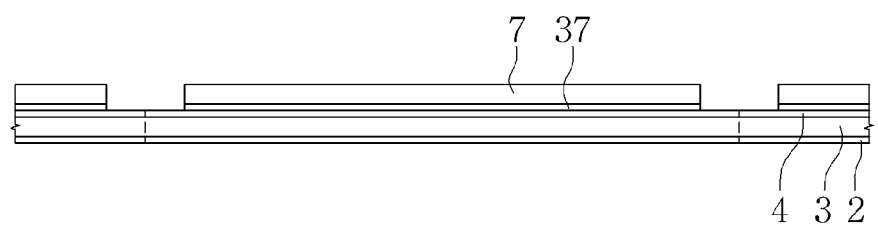

SEMICONDUCTOR PACKAGE HAVING PLURAL SEMICONDUCTOR CHIPS AND METHOD OF FORMING THE SAME

PRIORITY STATEMENT

This application claims priority under 35 U.S.C. §119 to Korean Patent Application No. 10-2011-0088093 filed on Aug. 31, 2011, the disclosure of which is hereby incorporated by reference in its entirety.

BACKGROUND

1. Field

The inventive concept relates to semiconductor packages having a plurality of semiconductor chips and to methods of manufacturing the same. More specifically, the inventive concept relates to a semiconductor package having stacked semiconductor chips and to a method of manufacturing the same.

2. Description of Related Art

Today's semiconductor packages must be small and yet provide a large capacity to store and/or process data in order to meet the current demand for light, thin, and compact mobile devices which are also multi-functional. A technique of stacking chips has been used to provide semiconductor packages that provide a large capacity to store and/or process data.

A basic chip stacking technique includes stacking a plurality of semiconductor chips on a substrate and electrically connecting the chips to the substrate, and encapsulating the chips. This technique is also useful, to some extent, in helping to minimize the thickness of the package compared to other techniques of integrating the same type and number of chips.

However, for at least some applications, conventional multi-chip packaging techniques still make it difficult to realize a package that is thin and can operate at a high speed.

SUMMARY

According to an aspect of the inventive concept, there is provided a semiconductor package comprising a substrate, a first semiconductor chip disposed on the substrate, a first encapsulant covering the first semiconductor chip, a plurality of second semiconductor chips stacked vertically one atop the other on the first encapsulant, and a second encapsulant covering the stack of second semiconductor chips. The first encapsulant has first and second sidewall surfaces facing in opposite directions, and third and fourth sidewall surfaces facing in opposite directions. The third sidewall surface joins and subtends an angle with the first sidewall surface, and the second encapsulant covers the first sidewall surface of the first encapsulant and exposes the third sidewall surface of the first encapsulant.

According to another aspect of the inventive concept, there is provided a semiconductor package comprising a substrate having upper and lower surfaces, a first bond finger, a second bond finger and a third bond finger disposed at and spaced from one another along an upper surface of the substrate, a first semiconductor chip disposed on the upper surface of and mounted to the substrate, a first conductive connection extending between and electrically connecting the first bond finger and the first semiconductor chip, a first encapsulant encapsulating the first semiconductor chip and the first conductive connection on the substrate, a lower chip stack disposed on the first encapsulant and including a plurality of second semiconductor chips, an upper chip stack disposed on the lower chip stack and including a plurality of third semiconductor chips, a second conductive connection extending directly between and electrically connecting the second bond finger and one of the second semiconductor chips of the lower chip stack, a third conductive connection extending directly between and electrically connecting the third bond finger and one of the third semiconductor chips of the upper chip stack, and a second encapsulant covering the first encapsulant, the lower chip stack, the upper chip stack, the second conductive connection and the third conductive connection. Furthermore, the sum of the distance between the first and second bond fingers and the length of the second conductive connection is substantially the same as the sum of the distance between the first and third bond fingers and the length of the third conductive connection.

According to still another aspect of the inventive concept there is provided a semiconductor package comprising a circuit board, a first semiconductor chip disposed on and electrically connected to the circuit board, a first encapsulant molded to the circuit board and encapsulating the first semiconductor chip on the circuit board, second semiconductor chips stacked vertically one atop the other on the first encapsulant and electrically connected to the circuit board independently of the first semiconductor chip, and a second encapsulant molded to the circuit board and covering the stack of second semiconductor chips, and in which each of the second chips has a larger dimension in a given horizontal direction parallel to the upper surface of the circuit board than the first semiconductor chip. In this respect, the footprint or surface area of each of the second semiconductor chips is larger than that of the first semiconductor chip.

BRIEF DESCRIPTION OF THE DRAWINGS

The foregoing and other features and advantages of the inventive concept will be apparent from the following detailed description of preferred embodiments of the inventive concept, as illustrated in the accompanying drawings. In the drawings:

FIGS. 15 to 32 illustrate a method fabricating a semiconductor package according to the inventive concept, in which FIGS. 15, 18, 21, 24, 27 and 30 are each a plan view of the package during the course of its manufacture, and FIGS. 16 and 17 are cross-sectional views taken along lines I-I' and II-II' of FIG. 15, respectively, FIGS. 19 and 20 are cross-sectional views taken along lines I-I' and II-II' of FIG. 18, respectively, FIGS. 22 and 23 are cross-sectional views taken along lines I-I' and II-II' of FIG. 21, respectively, FIGS. 25 and 26 are cross-sectional views taken along lines I-I' and II-II' of FIG. 24, respectively, FIGS. 28 and 29 are cross-sectional views taken along lines I-I' and II-II' of FIG. 27, respectively, FIGS. 31 and 32 are cross-sectional views taken along lines I-I' and II-II' of FIG. 30, respectively.

DETAILED DESCRIPTION OF THE EMBODIMENTS

Figure 1:
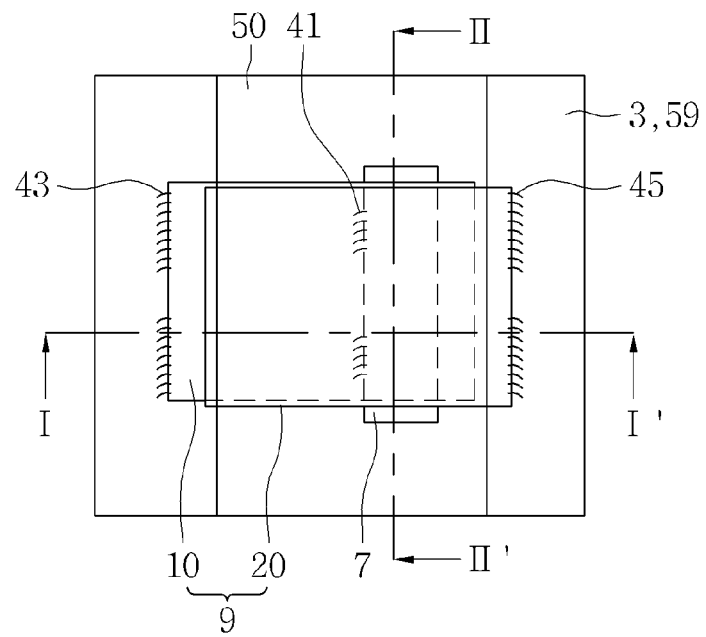
FIG. 1 is a plan view of a semiconductor package according to the inventive concept.

Various embodiments and examples of embodiments of the inventive concept will be described more fully hereinafter with reference to the accompanying drawings. In the drawings, the sizes and relative sizes and shapes of elements and layers shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer in question is referred to as being "on" another element or layer, the element or layer in question can be directly on the other element or layer or an intervening element(s) or layer(s) may be present. Likewise, it will be understood that if an element or layer is referred to as being "connected" to another element or layer, the element or layer in question can be directly or indirectly connected to the other element or layer.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. Also, given the nature of the inventive concept, the term "connected" will generally refer to an electrical connection even if not expressly stated. The term "circuit board" will be used to refer to any type of substrate having a rigid or flexible insulating body and conductive patterns in the form of wiring and/or vias.

Figure 2A:
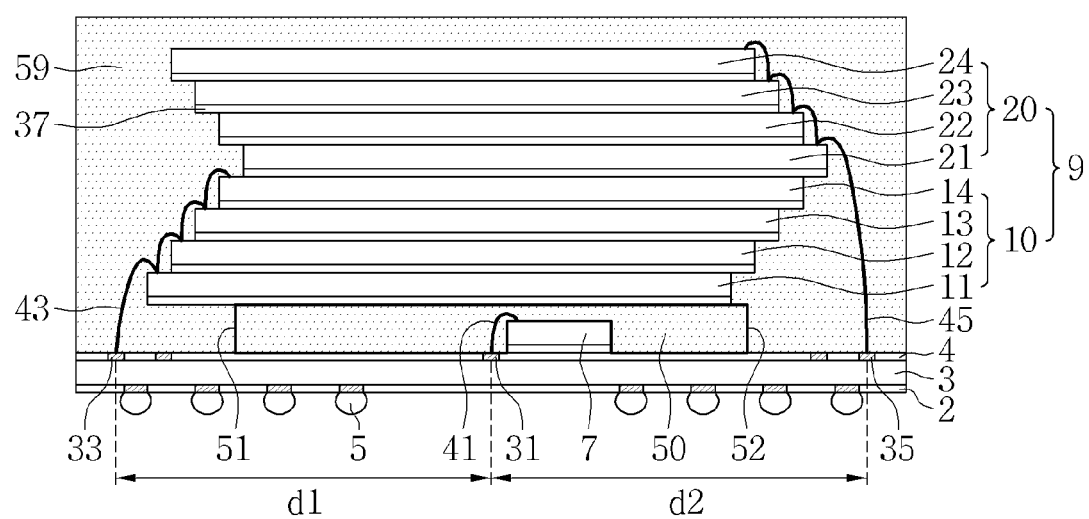
FIG. 2A is a cross-sectional view of the semiconductor package taken along line I-I' of FIG. 1.
Figure 2B:
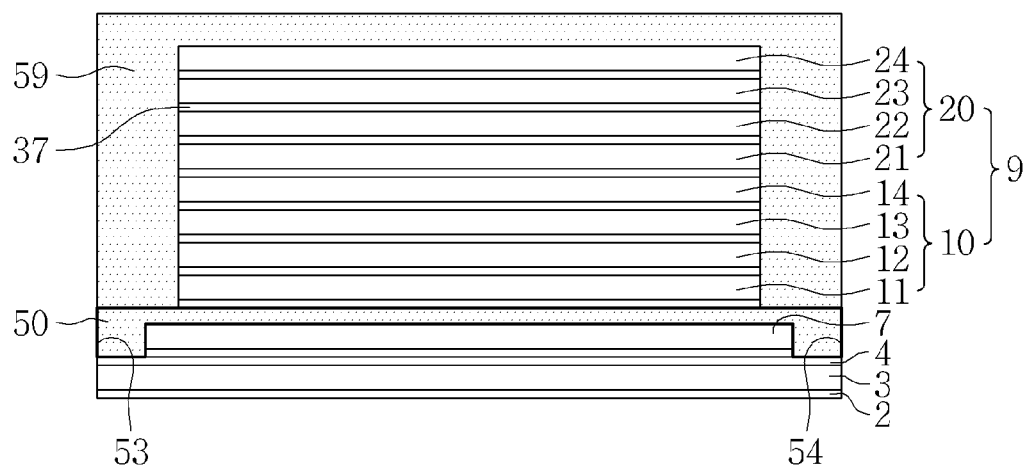
FIG. 2B is a cross-sectional view of the semiconductor package taken along line II-II' of FIG. 1.

A semiconductor package according to the inventive concept will now be described in detail with reference to FIGS. 1, 2A and 2B.

The semiconductor package includes a substrate 3 having upper and lower surfaces covered with a lower layer of solder resist 2 and an upper layer of solder resist 4, respectively. First to third bond fingers 31, 33 and 35 are disposed on the upper surface of the substrate 3 and extend through the upper layer of solder resist 4.

The semiconductor package also includes a first semiconductor chip 7 mounted on the substrate 3 by an adhesive film 37, for example. A first conductive connection 41 extends between and electrically connects the first semiconductor chip 7 and the first bond finger 31. The first semiconductor chip 7 and the first conductive connection 41 are covered with and hence, encapsulated by, a first encapsulant 50.

The semiconductor package also includes a plurality of chips 9 mounted on the first encapsulant 50. The chips 9 may include a first stack of chips 10 (referred to hereinafter as a first or lower "chip stack") and a second stack of chips 20 (referred to hereinafter as a second or upper "chip stack") disposed on the first chip stack 10. The first chip stack 10 may include second to fifth (lower) semiconductor chips 11, 12, 13 and 14. The second chip stack 20 may include sixth to ninth (upper) semiconductor chips 21, 22, 23 and 24. The first semiconductor chip 7 may be a logic chip such as a controller. The second to ninth semiconductor chips 11, 12, 13, 14, 21, 22, 23 and 24 may be memory chips that constitute a nonvolatile memory, such as a NAND flash. In any case, the chips 9 are each generally larger, in terms of their surface area, than the first semiconductor chip 7. In this respect, and as shown in FIG. 1, the chips 7 and 9 are oriented such that the dimensions of each of chips 9 in a given direction (the direction of line I-I' in the figure) are greater than the dimension of the chip 7 in the same given direction.

The second to fifth semiconductor chips 11, 12, 13 and 14 may also be mounted on the first encapsulant 50 and one atop the other by adhesive film 37. The second to fifth semiconductor chips 11, 12, 13 and 14 may also be stacked in a cascading manner to form a first cascading structure. Likewise, the sixth to ninth semiconductor chips 21, 22, 23 and 24 may be mounted to the fifth semiconductor chip 14 and one atop the other by adhesive film 37. The sixth to ninth semiconductor chips 21, 22, 23 and 24 may also be stacked in a cascading manner to form a second cascading structure. In this case, the first and second cascading structures may be symmetrical and more specifically, may exhibit mirror symmetry about a horizontal plane extending therebetween. Thus, as shown in FIG. 2A, the first cascading structure may be in the form steps extending gradually uphill from one side of the package (from the left side toward the right side of the package in the figure), and the second cascading structure may be in the form of steps extending gradually uphill from the opposite side of the package (from the right side toward the left side of the package in the figure).

Alternatively, the second to ninth semiconductor chips 11, 12, 13, 14, 21, 22, 23 and 24 are stacked on the first encapsulant 50 and all one atop the other in a cascading manner to form a single cascading structure (in the form of steps extending gradually uphill in one direction). In other examples of this embodiment, the second to ninth semiconductor chips 11, 12, 13, 14, 21, 22, 23 and 24 are stacked in an overhanging manner, or a zigzagging manner. Of course, the chips may be stacked in various combinations of these ways just as long as the pads of each chip, by which the internal circuitry of the chip is connected to the substrate 3 as described below, are left exposed enough by the other chips. In yet another example of this embodiment, the second to ninth semiconductor chips 11, 12, 13, 14, 21, 22, 23 and 24 are vertically aligned with one another.

The second to fifth semiconductor chips 11, 12, 13 and 14 are connected to the second bond fingers 33 by second conductive connections 43. The sixth to ninth semiconductor chips 21, 22, 23 and 24 are connected to the third bond fingers 35 by third conductive connections 45. In this example, as shown in FIG. 2A, the second conductive connections 43 connect the second bond fingers 33 to the lowermost semiconductor chip of the lower chip stack 10, and the semiconductor chips 11, 12, 13 and 14 of the lower chip stack 10 are connected in series. Similarly, the third conductive connections 45 connect the lowermost semiconductor chip of the upper chip stack 20 to the third bond fingers 35, and the semiconductor chips 21, 22, 23 and 24 of the upper chip stack 20 are connected in series.

Also, in the examples in which the second to ninth semiconductor chips 11, 12, 13, 14, 21, 22, 23 and 24 are stacked in a manner in which each lowermost chip of a chip stack 10 and 20 is offset horizontally from the chip stacked directly thereon, the first to third conductive connections 41, 43 and 45 may be bonding wires such as gold or aluminum wires. In this case, the third conductive connections 45 are longer than the second conductive connections 43. The chips constituting each chip stack 10 and 20 may also be connected to one another by bonding wires.

The inventive concept is not limited, however, to the types of connections shown in the drawings for connecting respective ones of the chips 7 and 9 to the substrate, and respective ones of the chips 9 to one another. Rather, in addition to the aforementioned bonding wires, each connection may be constituted by a beam lead, conductive tape, a conductive spacer, a through silicon via, a solder ball, or a solder bump, and these types of connection may even be used in combination in some instances.

The semiconductor package may also include external terminals 5 disposed on the lower surface of the substrate 3. The external terminals 5 may be solder balls, solder bumps, a pin grid array, a lead grid array, conductive tabs, or a combination thereof. In these cases, the external terminals 5 extend through the lower layer of solder resist 2, and are electrically connected to the first to third bond fingers 31, 33 and 35 through the substrate 3 (by internal wiring and/or vias of the substrate).

In another example of the present embodiment, in which the package constitutes an electronic card such a memory card, the package does not include the external terminals 5.

The chips 9, the second conductive connections 43, the third conductive connections 45 and the first encapsulant 50 are covered with and hence, encapsulated by, a second encapsulant 59. The first and second encapsulants 50 and 59 may comprise a molding compound. In any case, the first encapsulant 50 has first to fourth sidewall surfaces 51, 52, 53 and 54. The first and second sidewall surfaces 51 and 52 face in opposite directions, the third and fourth sidewall surfaces 53 and 54 face in opposite directions, and each of the first and second sidewall surfaces 51 and 52 subtend an angle (in this example, a 90 degree angle) with each of the third and fourth sidewall surfaces 53 and 54. The first and second sidewall surfaces 51 and 52 are covered by the second encapsulant 59 as shown in FIG. 2A, and the third and fourth sidewall surfaces 53 and 54 are exposed (at the exterior of the package) as shown in FIG. 2B.

The sidewall surfaces of the substrate 3 may also be exposed. In this case, opposite sidewall surfaces of the substrate 3 may meet the third and fourth sidewall surfaces 53 and 54, along a first parallel lines, respectively, and may also meet opposite sidewall surfaces of the second encapsulant 59 along second parallel lines, respectively. More specifically, and in the illustrated example, one sidewall surface of the substrate 3, the third sidewall surface 53 of the first encapsulant and one sidewall surface of the second encapsulant 59 are coplanar, and another sidewall surface of the substrate 3, the fourth sidewall surface 54 of the first encapsulant and another sidewall surface of the second encapsulant 59 are coplanar.

The chips 9 are also arranged such that the second semiconductor chip 11 protrudes laterally, i.e., in the horizontal direction, beyond the location of the first sidewall surface 51 of the first encapsulant 50.

In another example of the present embodiment, a sidewall surface of the second semiconductor chip 11 is aligned vertically with the first sidewall surface 51 of the first encapsulant 50. Also, the first encapsulant 50 may have a dimension in a direction that is perpendicular to the first sidewall surface 51 that is greater than the dimension of the second semiconductor chip 11 in that same direction (the direction of line I-I' in FIG. 1). Alternatively, sidewall surfaces of the second semiconductor chip 11 may be vertically aligned, i.e., may be coplanar with the first and second sidewall surfaces 51 and 52 of the second semiconductor chip 11.

The first to third bond fingers 31, 33 and 35 may be electrically connected to each other through the substrate 3, i.e., by internal wiring and vias of the substrate 3. Furthermore, in this example, the first bond fingers 31 are located between the second bond fingers 33 and the third bond fingers 35. Also, the second bond fingers 33 may be spaced from the first bond fingers 31 by a first distance d1 that is the substantially the same as the second distance d2 over which the third bond fingers 35 are spaced from the first bond fingers 31. Alternatively, the second distance d2 may be smaller than the first distance d1.

As described above, a semiconductor package according to the inventive concept includes a plurality of relatively large (area-wise) semiconductor chips 9 stacked on a first encapsulant 50 encapsulating a relatively small first semiconductor chip 7. Thus, the semiconductor package has a high degree of structural integrity and yet, the thickness of the semiconductor package may be kept to a minimum. Also, a relatively short path along which data is transmitted to and from the relatively small chip first semiconductor chip 7 can be established in the package. This allows the package to operate at a relatively high speed, especially in the case in which the chip 7 is a logic chip.

Some of the examples referred to above, as well as other examples of a semiconductor package according to the inventive concept, are shown in FIGS. 3 to 14. In the description that follows, only the features/aspects of these examples which differentiate them from the other examples will be described in detail. That is, FIGS. 3-14 are used to show various features of embodiments or examples of embodiments of semiconductor packages according to the inventive concept.

Figure 3:
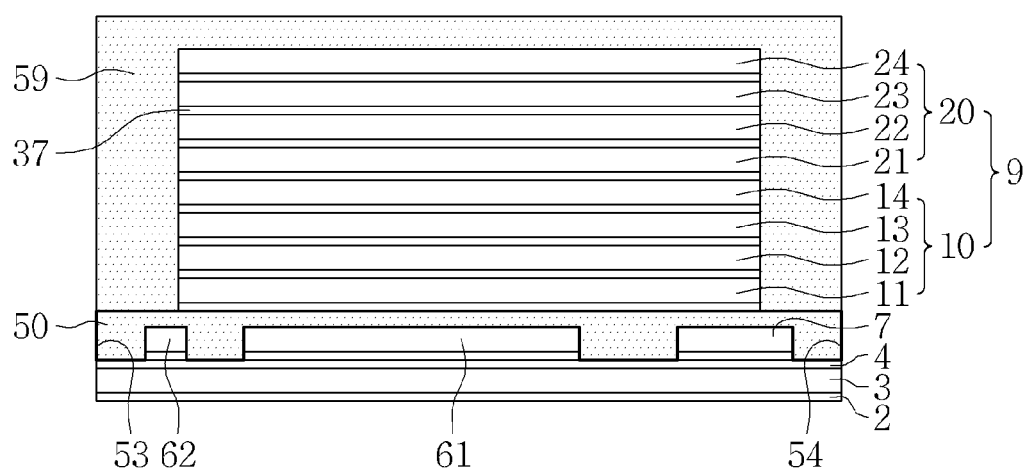
FIGS. 3 to 14 are each a cross-sectional view of another example of a semiconductor package according to the inventive concept.

In the example shown in FIG. 3, the semiconductor packages includes a first semiconductor chip 7, a buffer chip 61 and a passive element 62 mounted on a substrate 3. The first semiconductor chip 7, the buffer chip 61 and the passive element 62 are covered with a first encapsulant 50. Also, the first semiconductor chip 7, the buffer chip 61 and the passive element 62 are spaced from each other and electrically connected to each other by means of the substrate 3.

The buffer chip 61 may include a random access memory (RAM). For example, the buffer chip 61 may include a volatile memory device, such as a dynamic RAM (DRAM) or a static RAM (SRAM). The passive element 62 may be a chip capacitor, a chip resistor, or an inductor. In the case in which the chip element 62 is a chip capacitor, the chip capacitor may correspond to a decoupling capacitor.

Figure 4:
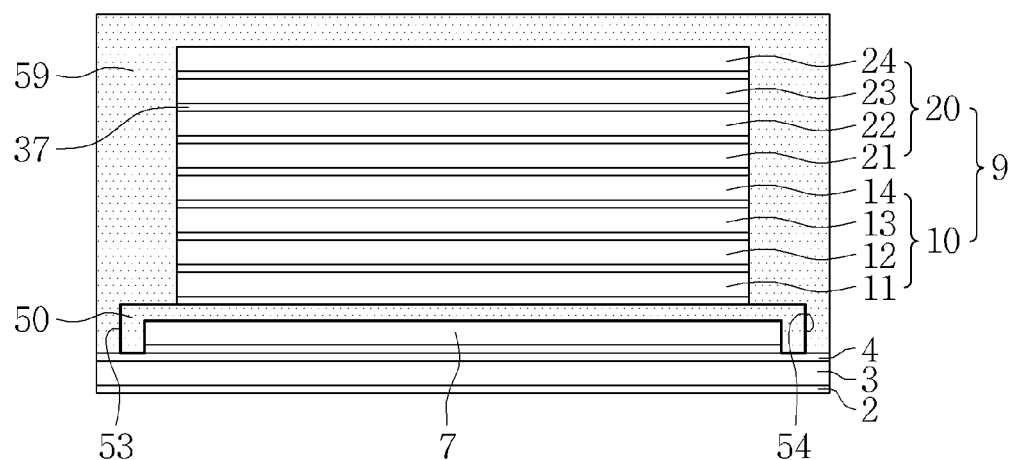

In the example shown in FIG. 4, third and fourth sidewall surfaces 53 and 54 of the first encapsulant 50 are covered with a second encapsulant 59. Also, sidewall surfaces of the second encapsulant 59 are vertically aligned and coplanar with the sidewall surfaces of the substrate 3, respectively.

Figure 5:
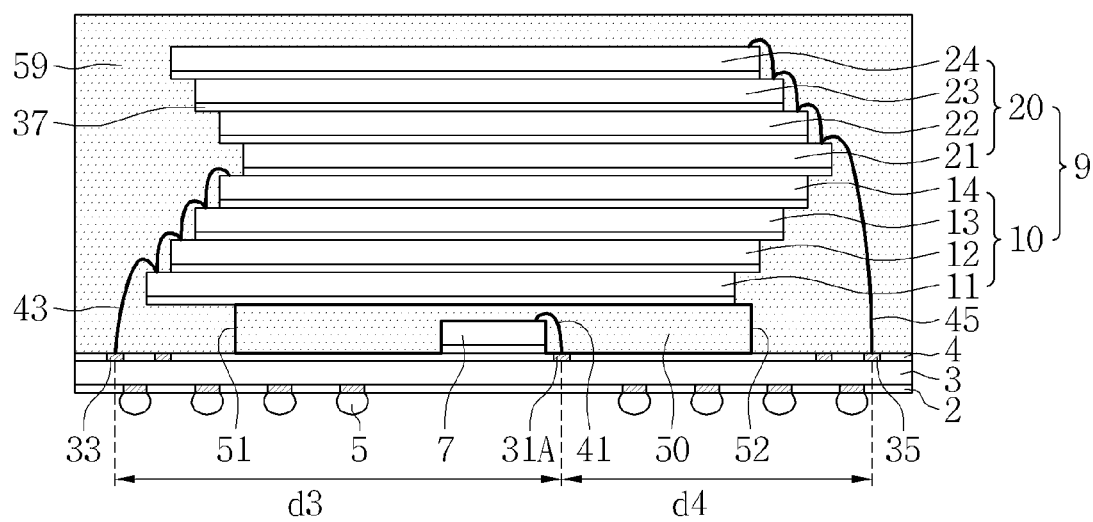

In the example shown in FIG. 5, first bond fingers 31A are spaced from second bond fingers 33 by a first distance d3, and first bond fingers 31A are spaced from third bond fingers 35 by a second distance d4 greater than the first distance d3. Furthermore, (each of) the third conductive connections 45 are longer than (each of) the second conductive connections 43. Finally, the sum of the first distance d3 and the length of a second conductive connection 43 is substantially the same as the sum of the second distance d4 and the length of a third conductive connection 45.

Accordingly, the paths along which data is transmitted between the chip stacks 10 and 20, respectively, and an external device via the semiconductor chip 7 and substrate 3 may be relatively uniform.

Figure 6:
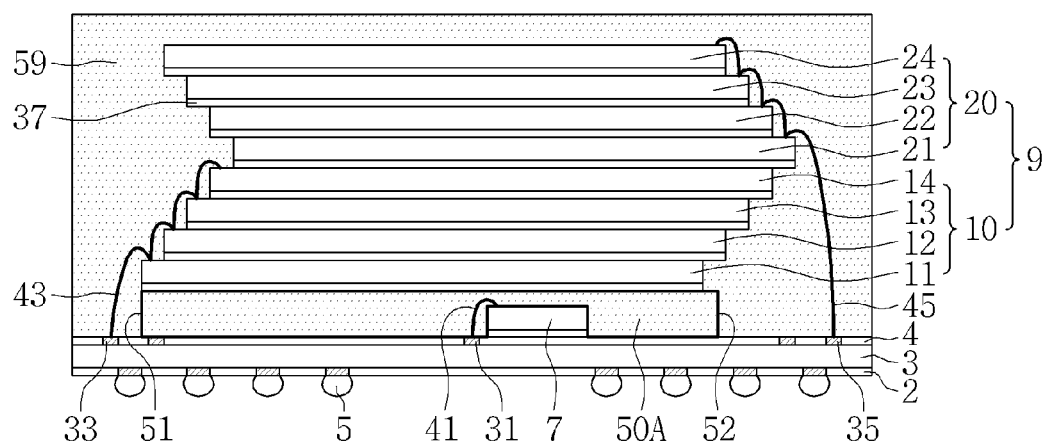

In the example shown in FIG. 6, a sidewall surface of the second semiconductor chip 11 is aligned vertically with a first sidewall surface 51 of a first encapsulant 50A. The first encapsulant 50A also has a dimension greater than the dimension of the second semiconductor chip 11 in a direction perpendicular to the first sidewall surface 51.

Figure 7:
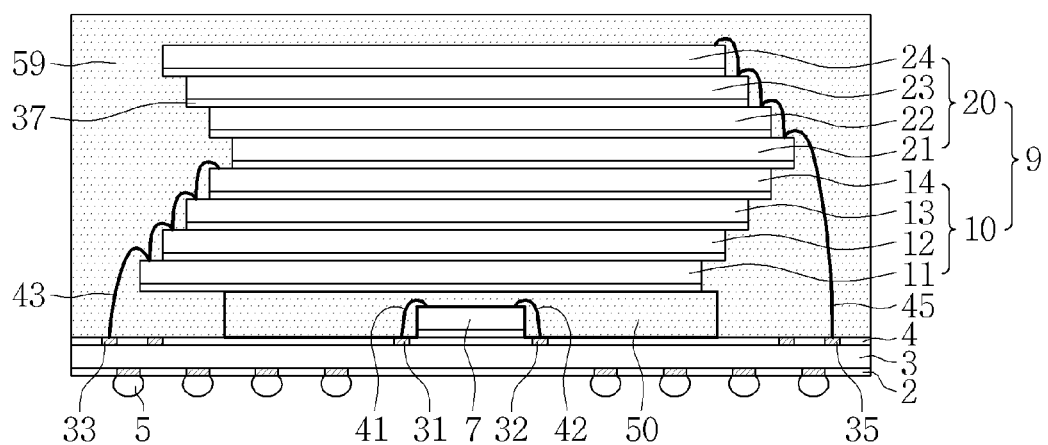

In the example shown in FIG. 7, first bond fingers 31 and fourth bond fingers 32 are disposed on the substrate 3. The first semiconductor chip 7 is mounted to the substrate 3 adjacent to and between the first bond fingers 31 and the fourth bond fingers 32. First conductive connections 41 extend between and electrically connect the first semiconductor chip 7 and the first bond fingers 31. Fourth conductive connections 42 extend between and electrically connect the first semiconductor chip 7 and the fourth bond fingers 32. The first semiconductor chip 7, the first conductive connections 41 and the fourth conductive connections 42 are covered with the first encapsulant 50.

Figure 8:
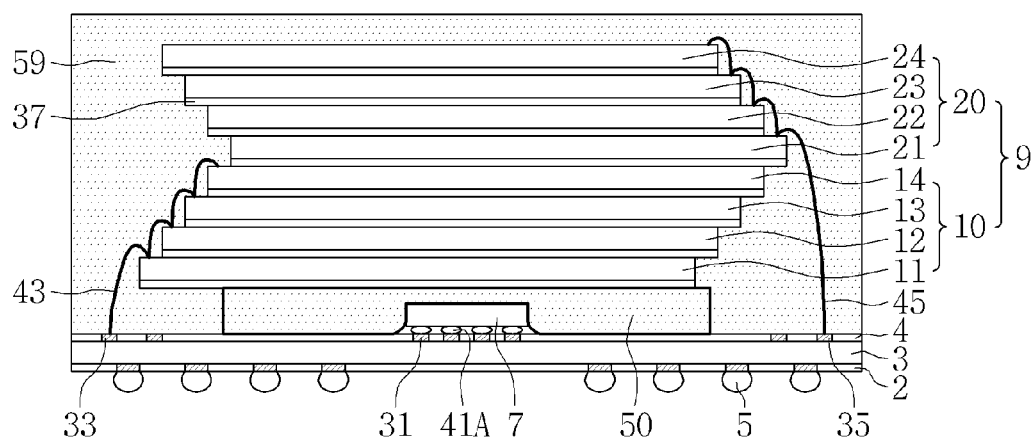

In the example shown in FIG. 8, the first semiconductor chip 7 is mounted on the substrate 3 using flip chip technology. First conductive connections 41A extend between and electrically connect the first semiconductor chip 7 and the first bond fingers 31. In this case, the first conductive connections 41A may be solder balls or solder bumps.

Figure 9:
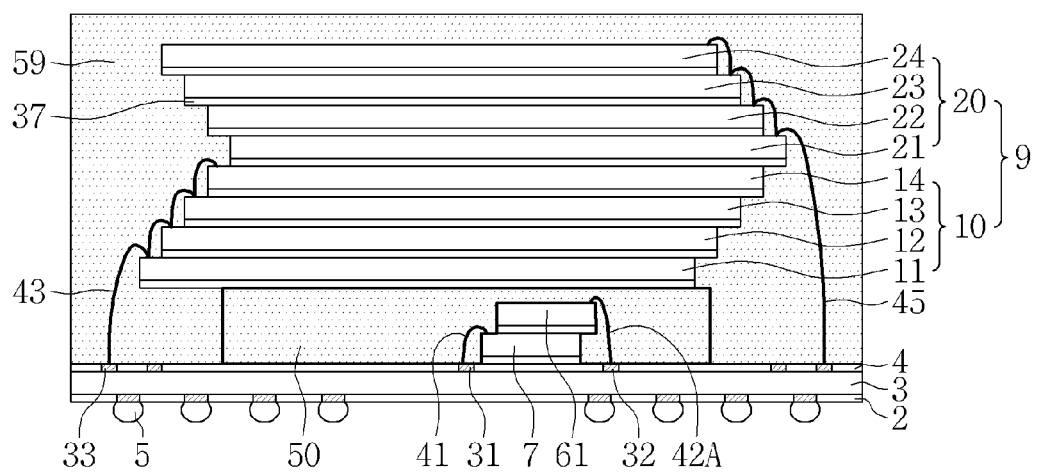

In the example shown in FIG. 9, a buffer chip 61 is mounted on the first semiconductor chip 7. Alternatively, the first semiconductor chip 7 may be mounted on the buffer chip 61. The buffer chip 61 may comprise a RAM. In either case, fourth conductive connections 42A extend between and electrically connect the fourth bond fingers 32 and the buffer chip 61. The first semiconductor chip 7, the first conductive connections 41, the fourth conductive connections 42A and the buffer chip 61 are covered with the first encapsulant 50.

Figure 10:
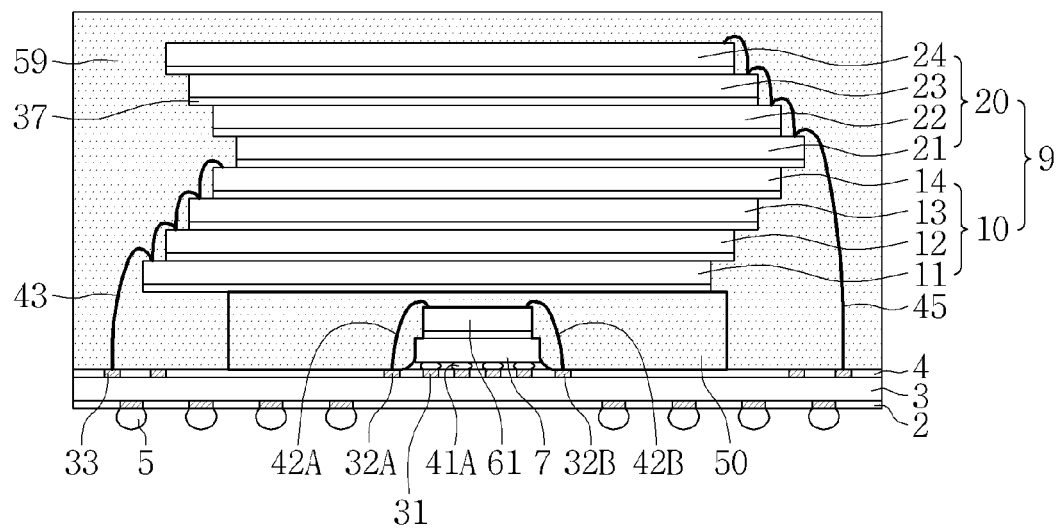

In the example shown in FIG. 10, the first semiconductor chip 7 is mounted on the substrate 3 using flip chip technology. The first conductive connections 41A extend between and electrically connect the first semiconductor chip 7 and the first bond fingers 31. In this case, the first conductive connection 41A may be solder balls or solder bumps.

The buffer chip 61 is mounted on the first semiconductor chip 7. Fourth conductive connections 42A extend between and electrically connect the fourth bond fingers 32A and the buffer chip 61, and fifth conductive connections 42B extend between and electrically connect fifth bond fingers 32B and the buffer chip 61. The fourth and fifth conductive connections 42A and 42B may be bonding wires. The first semiconductor chip 7, the first conductive connection 41A, the fourth and fifth conductive connections 42A and 42B, and the buffer chip 61 are covered with the first encapsulant 50.

Alternatively, the first semiconductor chip 7 may be mounted on the buffer chip 61. In this case, the buffer chip 61 is mounted on the substrate 3 using flip chip technology.

Figure 11:
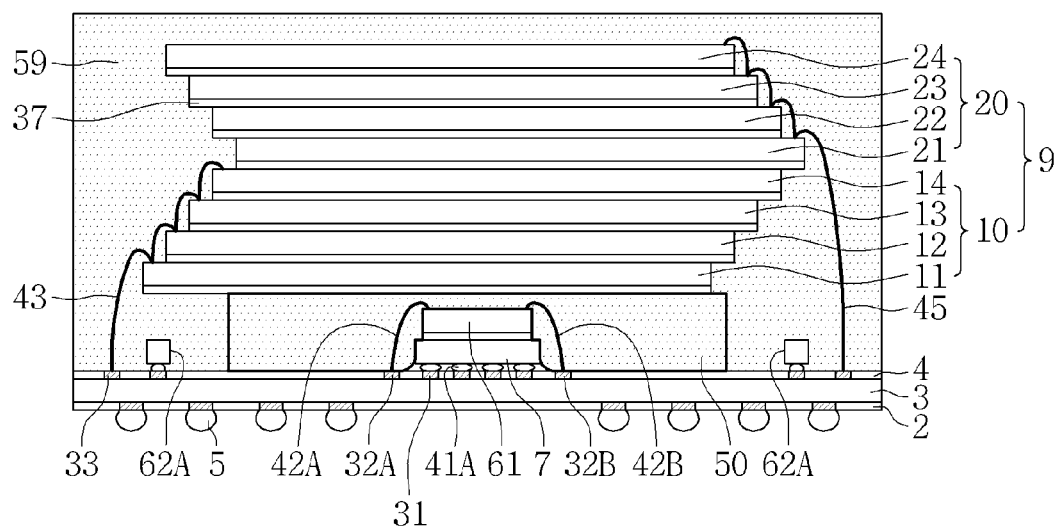

In the example shown in FIG. 11, passive elements 62A are mounted on the substrate 3. The passive elements 62A may be covered with the second encapsulant 59. That is, the passive elements 62A may be formed outside the first encapsulant 50. The passive elements 62A may include a chip capacitor, e.g., a decoupling capacitor, a chip resistor, or an inductor.

Figure 12:
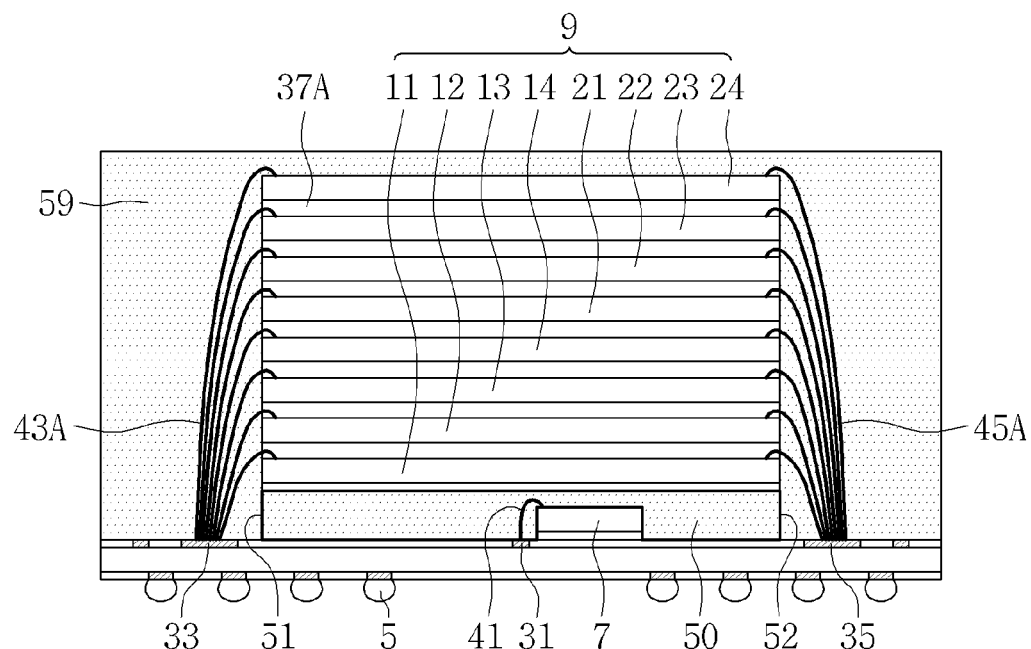

In the example shown in FIG. 12, the semiconductor chips 9 form an overhanging stacked structure on the first encapsulant 50. In this case, opposite sidewall surfaces of each of semiconductor the chips 9, e.g., each of the second to ninth semiconductor chips 11, 12, 13, 14, 21, 22, 23 and 24, are aligned vertically with the first and second sidewall surfaces 51 and 52 of the first encapsulant 50.

Furthermore, each of the semiconductor chips 9 is connected to the second and third bond fingers 33 and 35 by second and third conductive connections 43A and 45A. The second and third conductive connections 43A and 45A may be bonding wires. In this case, each bonding wire may connect a respective one of the semiconductor chips 9, e.g. a respective one of the second to ninth semiconductor chips 11, 12, 13, 14, 21, 22, 23 and 24, to a respective second bond finger 33 or third bond finger 35.

Adhesive film 37A is interposed between adjacent ones of the second to ninth semiconductor chips 11, 12, 13, 14, 21, 22, 23 and 24. The adhesive film 37A may be a die attach tape such as a film over wire (FOW). The adhesive film 37A may cover parts of the second and third conductive connections 43A and 45A. That is, each of the bonding wires may extend through the adhesive film 37A.

Figure 13:
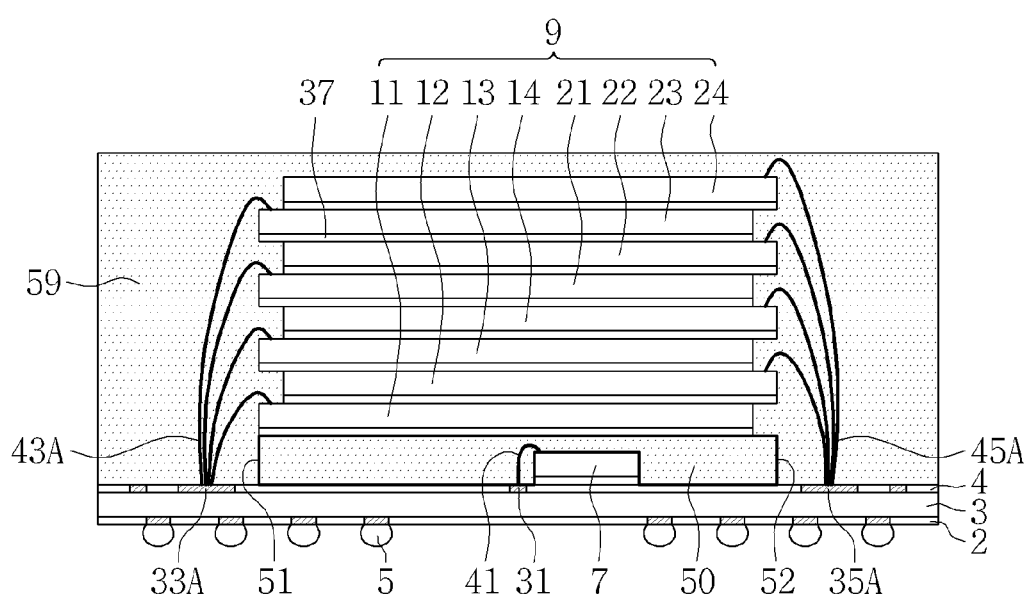

In the example shown in FIG. 13, the stack of semiconductor chips 9 forms a zigzagging structure on the first encapsulant 50. Each of the chips 9 is connected to the second bond fingers 33A or to the third bond fingers 35A by the second conductive connections 43A or the third conductive connections 45A.

Figure 14:
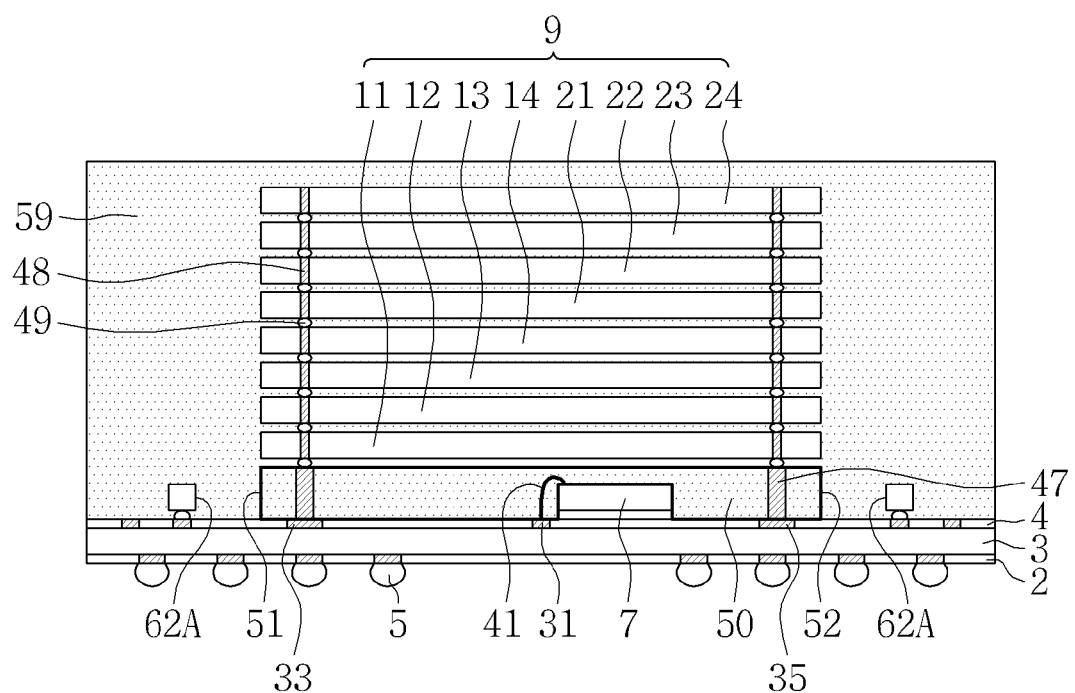

In the example shown in FIG. 14, the semiconductor chips 9 are vertically aligned on the first encapsulant 50. First through silicon vias 47 extend through the first encapsulant 50. The first through silicon vias 47 are connected to the second bond fingers 33 and the third bond fingers 35. Each of the semiconductor chips 9, e.g., each of the second to ninth semiconductor chips 11, 12, 13, 14, 21, 22, 23 and 24, includes second through silicon vias 48. The semiconductor package also has solder balls 49 on the second through silicon vias 48, respectively. The chips 9 are electrically connected to the second and third bond fingers 33 and 35 by the second through silicon vias 48, the solder balls 49 and the first through silicon vias 47. Thus, each set of electrically connected conductors made up of at least one second through silicon via 48, solder ball 49 and first through silicon via 47 constitutes a conductive connection.

A method of manufacturing a semiconductor package according to the inventive concept will now be described with reference to FIGS. 15 to 32. For a detailed description of the components that make up the package, reference may be made to the descriptions above.

Referring first to FIGS. 15 to 17, first semiconductor chip 7 is mounted on substrate 3 using an adhesive film 37. The substrate 3 may be a rigid printed circuit board (PCB), a flexible PCB, or a rigid-flexible PCB. As shown, several rows and columns of the first semiconductor chips 7 may be provided on the substrate 3 in this step such that several of the semiconductor packages can be mass produced. Reference may be made, though, to the fabricating of only one semiconductor package, for ease of description.

Also, the first semiconductor chips 7 are electrically connected to the first bond fingers 31. This may be accomplished as part of the process of mounting the chips 7 to the substrate 3 (as in the case of using flip chip technology) or by a subsequent process as in the illustrated example. That is, for example, the first semiconductor chips 7 are wire bonded to the first bond fingers 31.

Figure 18:
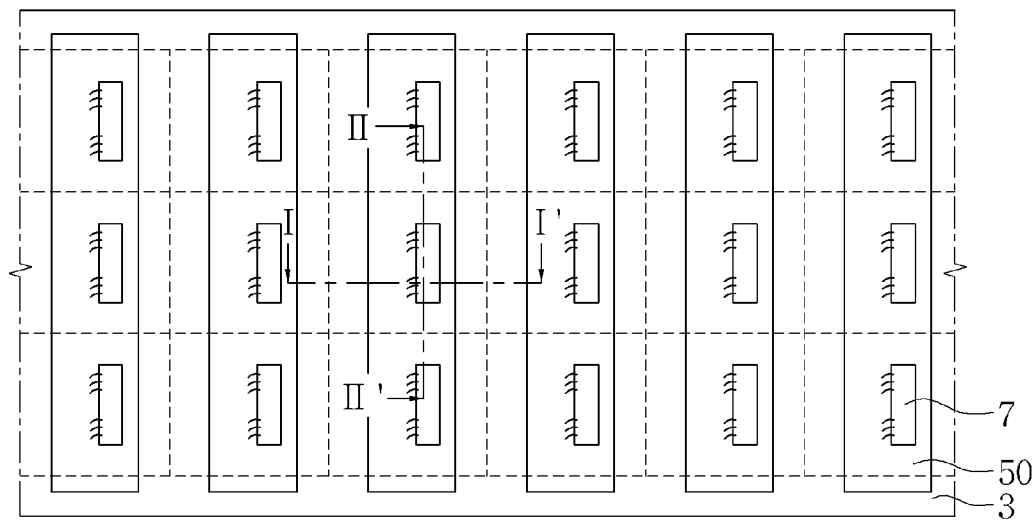
Figure 19:
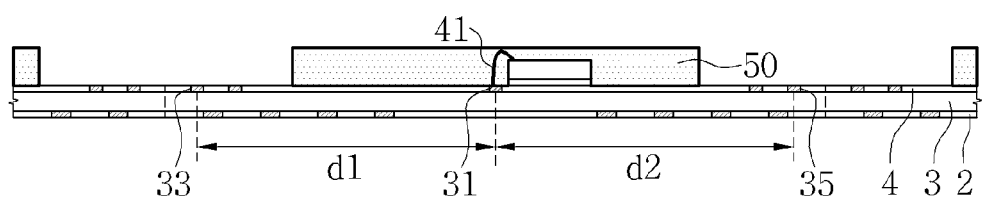
Figure 20:
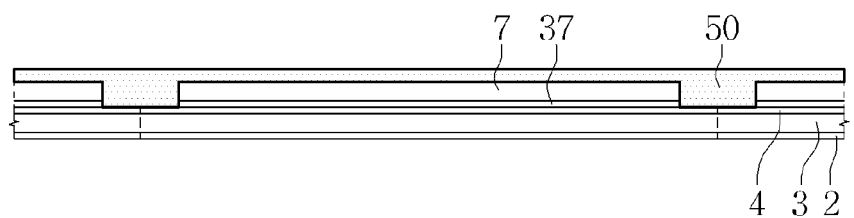

Referring to FIGS. 18 to 20, a first encapsulant 50 is formed over each first semiconductor chip 7 and over the bonding wires in this example. The first encapsulant 50 may be formed using an injection molding technique. Also, in this example, lines of encapuslant are formed each extending longitdunially over a respective column of first semiconductor chips 7.

Figure 21:
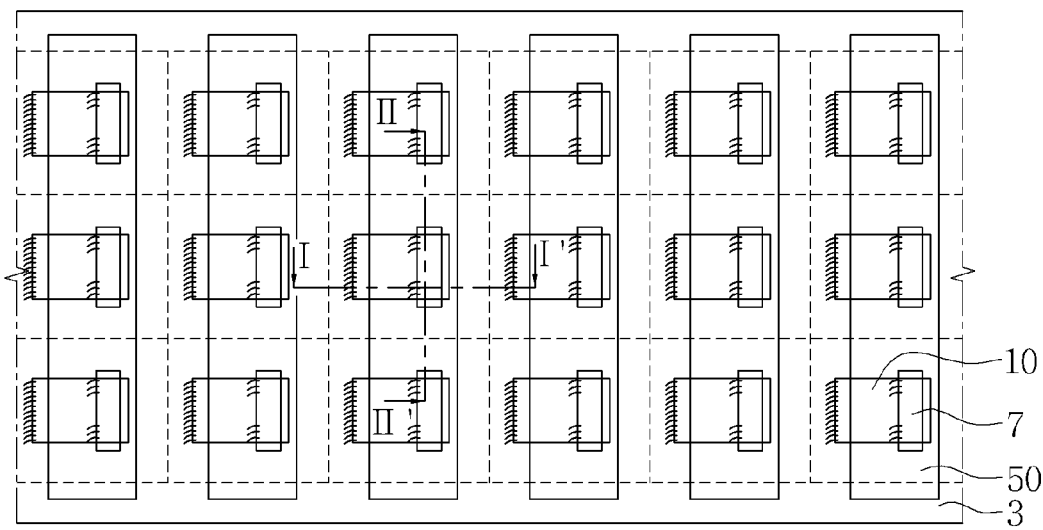
Figure 22:
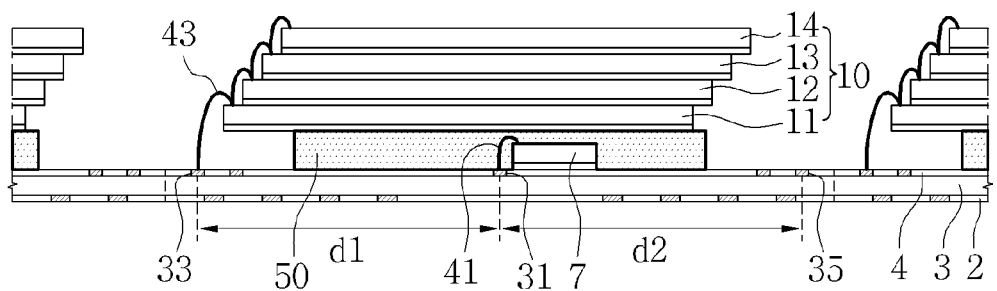
Figure 23:
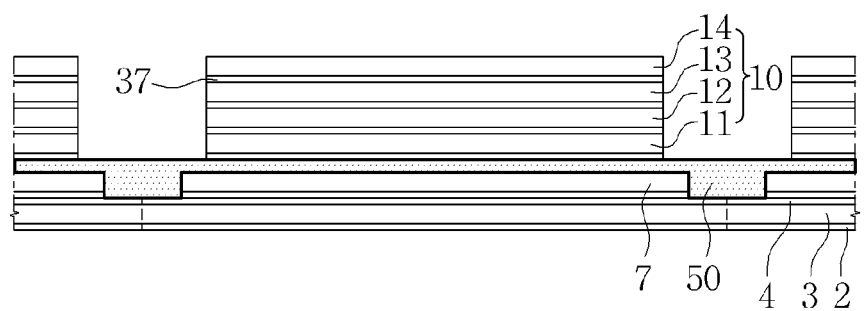

Referring to FIGS. 21 to 23, a respective first chip stack 10 may be mounted on and to the first encapsulant 50 over each first semiconductor chip 7. The first chip stack 10 may include second to fifth semiconductor chips 11, 12, 13 and 14. More specifically, the second to fifth semiconductor chips 11, 12, 13 and 14 may be stacked on the first encapsulant 50 in such a way as to form a cascading structure.

In this example, the second semiconductor chip 11 is mounted on the first encapsulant 50 using adhesive film 37. At this time, one sidewall surface of the second semiconductor chip 11 protrudes horizontally beyond the location of the corresponding sidewall surface of the first encapsulant 50. That is, the second semiconductor chip 11 may be offset relative to the first encapsulant 50 in a direction towards the second bond fingers 33. The second to fifth semiconductor chips 11, 12, 13 and 14 are stacked such that they are horizontally offset with respect to the third bond fingers 35 towards the second bond fingers 33.

The chip stack 10 is also electrically connected to the substrate 3 and hence, to the first semiconductor chip 7 via the substrate 3. Again, depending on the type of chips and electrical connections used, this step may occur concurrently with the stacking of the second to fifth semiconductor chips 11, 12, 13 and 14 one atop the other, or after the chips are stacked on the first encapsulant 50. In this example, the second semiconductor chip 11 is wire-bonded directly to the second bond fingers 33, and each of the third to fifth semiconductor chips 11, 12, 13 is wire-bonded directly to the semiconductor chip below it.

Figure 24:
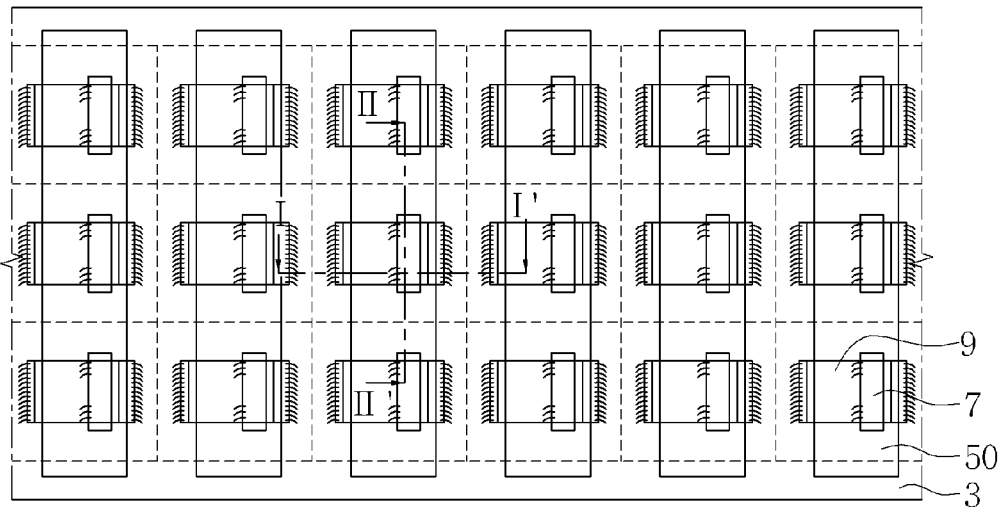
Figure 25:
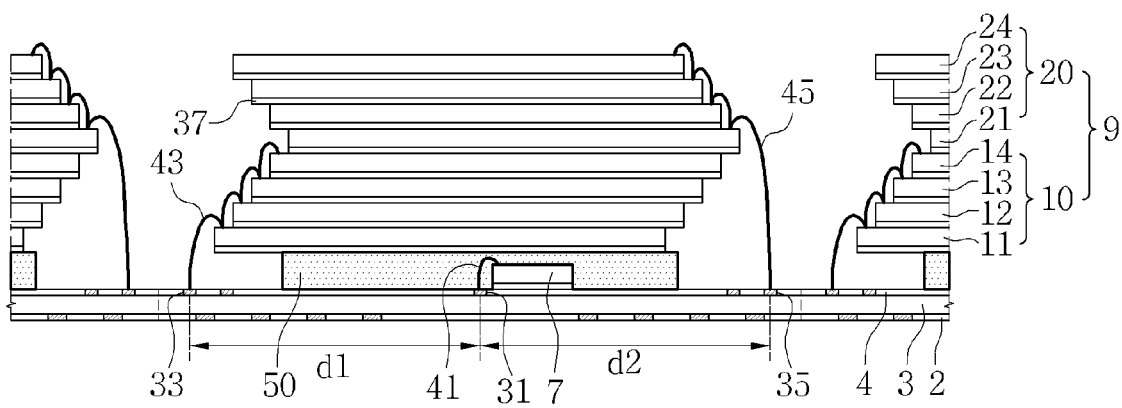
Figure 26:
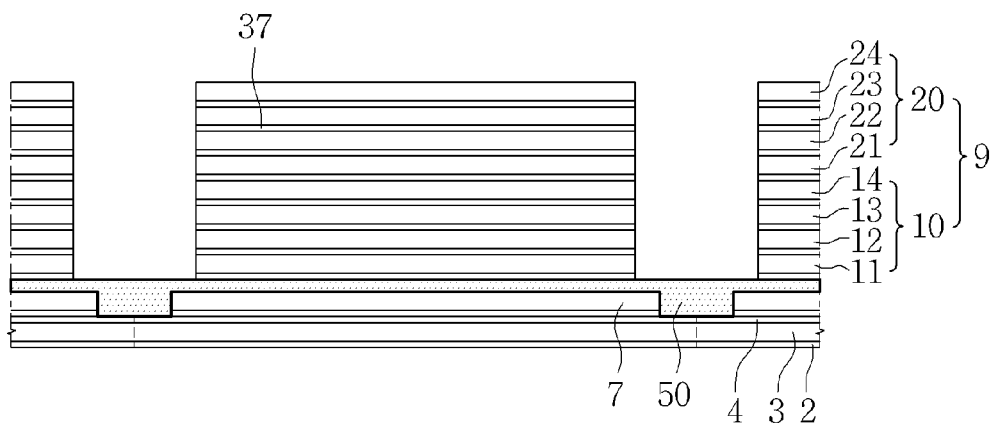

Referring to FIGS. 24 to 26, a second chip stack 20 is mounted on the first chip stack 10 and electrically connected to the substrate 3. This process(es) may be similar to that/those described above.

For example, the sixth semiconductor chip 21 may be mounted on the fifth semiconductor chip 14 using adhesive film 37 as offset relative to the chip 14 in a direction towards the third bond fingers 35. The seventh to ninth semiconductor chips 22, 23 and 24 are mounted sequentially one atop the other with each chip 22, 23 or 24 being offset in a direction towards the second bond fingers 33 relative to the chip on which it is directly mounted.

Also, in this example, the sixth semiconductor chip 21 is wire-bonded directly to the third bond fingers 35. The sixth to ninth semiconductor chips 21, 22, 23 and 24 may also be wire-bonded to each other, as best shown in FIG. 25.

Figure 27:
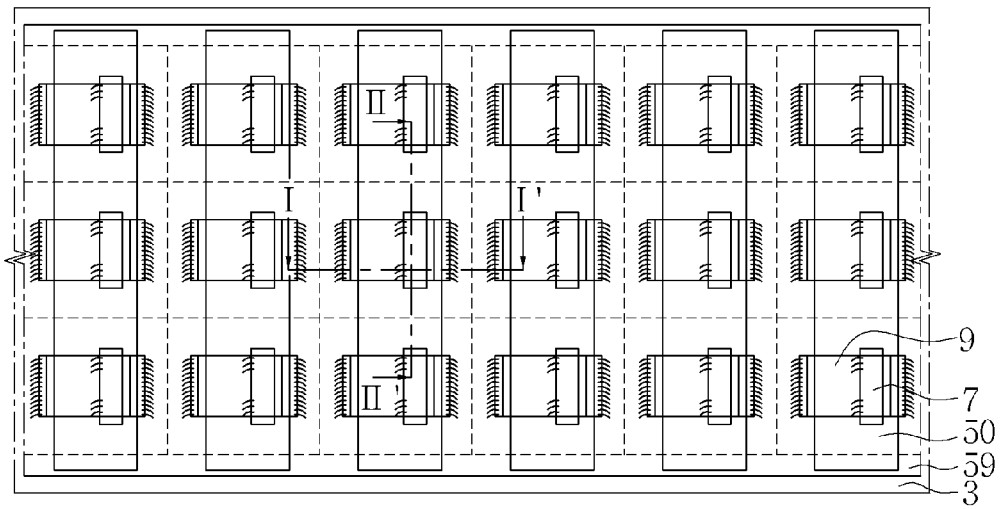
Figure 28:
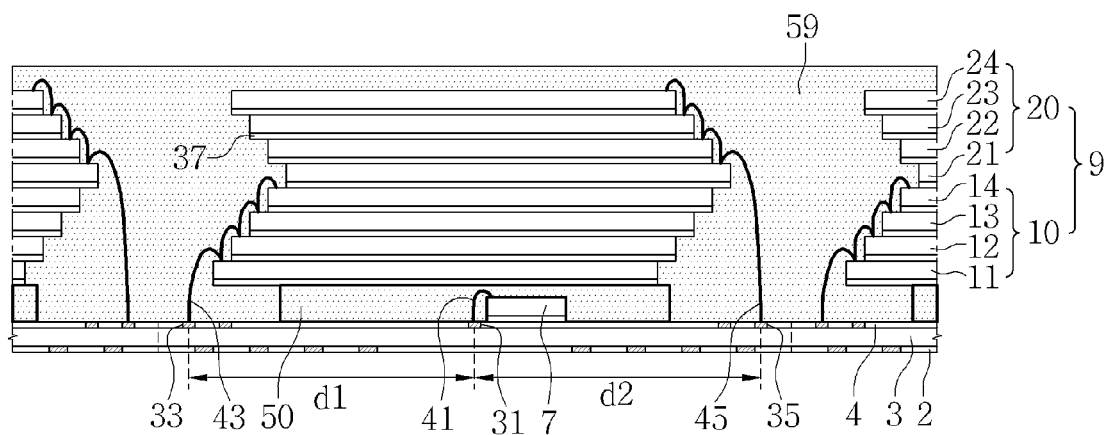
Figure 29:
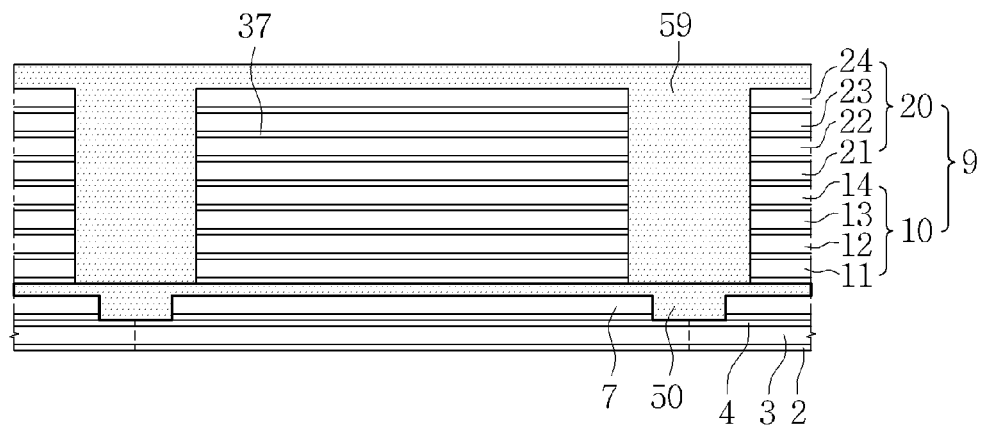

Referring to FIGS. 27 to 29, a second encapsulant 59 is then formed on the substrate 3 over the first encapsulant 50 and the chips 9 and, in this case in which the chips 9 are wire-bonded to the substrate 3, over the boding wires (the second and third 43 and 45 conductive connections). The second encapsulant 59 may also be formed using an injection molding technique.

Figure 30:
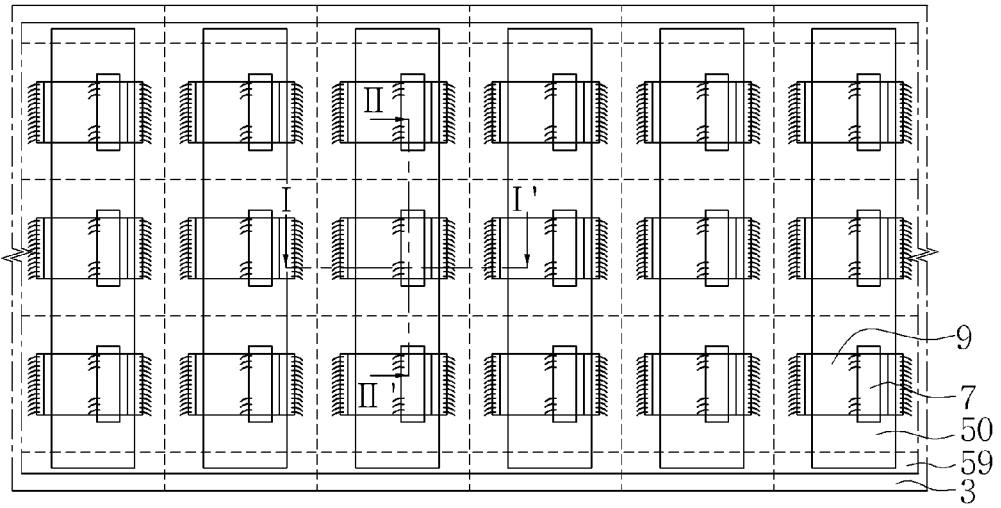
Figure 31:
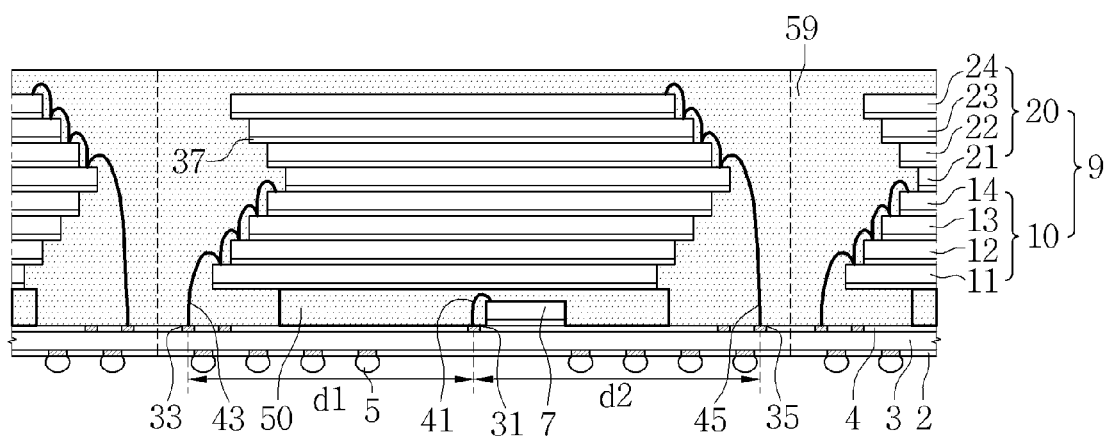
Figure 32:
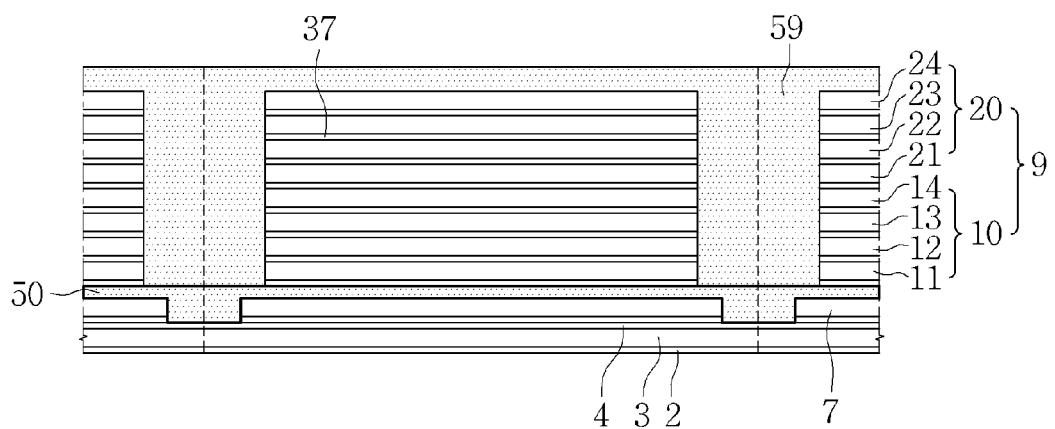

Referring to FIGS. 30 to 32, external terminals 5 may be formed on the lower surface of the substrate 3 as electrically connected to internal wiring and vias of the substrate 3. However, as mentioned above, this step may be omitted in the case of manufacturing some types of packages such as memory cards. In any case, the structure formed of the second encapsulant 59, the first encapsulant 50 and the substrate 3 is then cut (along the dotted lines in FIGS. 30-32). As a result, at least one semiconductor package, similar to that described with reference to FIGS. 1, 2A and 2B in the illustrated example, is formed.

As described above, a method of fabricating a semiconductor package according to the inventive concept includes forming a line of first encapsulant 50 on a substrate 3, forming a second encapsulant 59 on the first encapsulant 50, and simultaneously cutting the substrate 3, the first encapsulant 50 and the second encapsulant 59. Hence, sidewall surfaces of the substrate 3, sidewall surfaces of the first encapsulant 50, and sidewall surfaces of the second encapsulant 59 may be coplanar. Therefore, as compared with a package-on-package (PoP) or package-in-package (PiP), in which a lower package and an upper package are fabricated separately and then assembled to each other, a semiconductor package according to the inventive concept can be fabricated by a simpler method and by a method in which the thermal energy applied to the substrate 3 is minimal. Also, the method of fabricating a semiconductor package according to the inventive concept is simpler and offers a higher yield than a method in which a first encapsulant is formed on a substrate, a structure including the substrate and the first encapsulant is cut, and then a second encapsulant is formed on the resulting structure.

Also, in applications in which solder balls are used, a tool such as a tray or sheet is required to prevent the solder balls from being melted during an encapsulation process. When the method according to the inventive concept is applied to the fabricating of a semiconductor package having solder balls, such as a BGA package, the encapsulation processes are followed by the process of forming the solder balls. Thus, the heat of an encapsulation process, such an injection molding process, is not applied to the solder balls, Thus, solder joint reliability (SJR) remains high without the costs and time associated with using separate protective tools for the solder balls.

Figure 33:
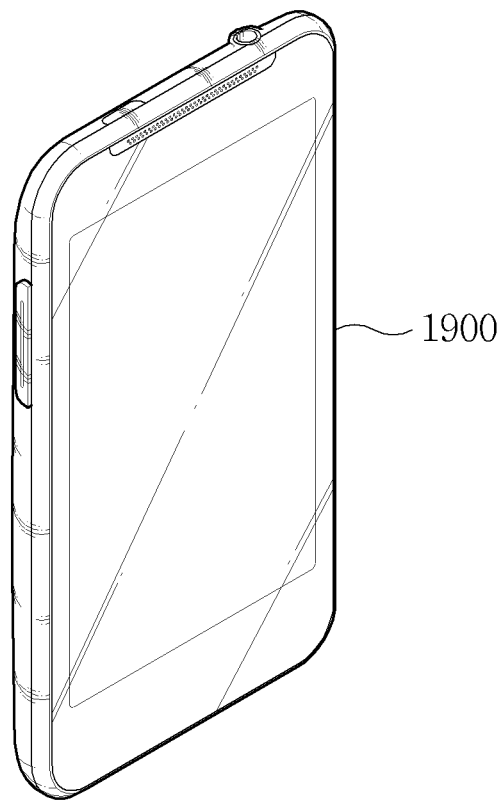
FIG. 33 is a perspective view of a mobile phone employing a semiconductor package according to the inventive concept.
Figure 34:
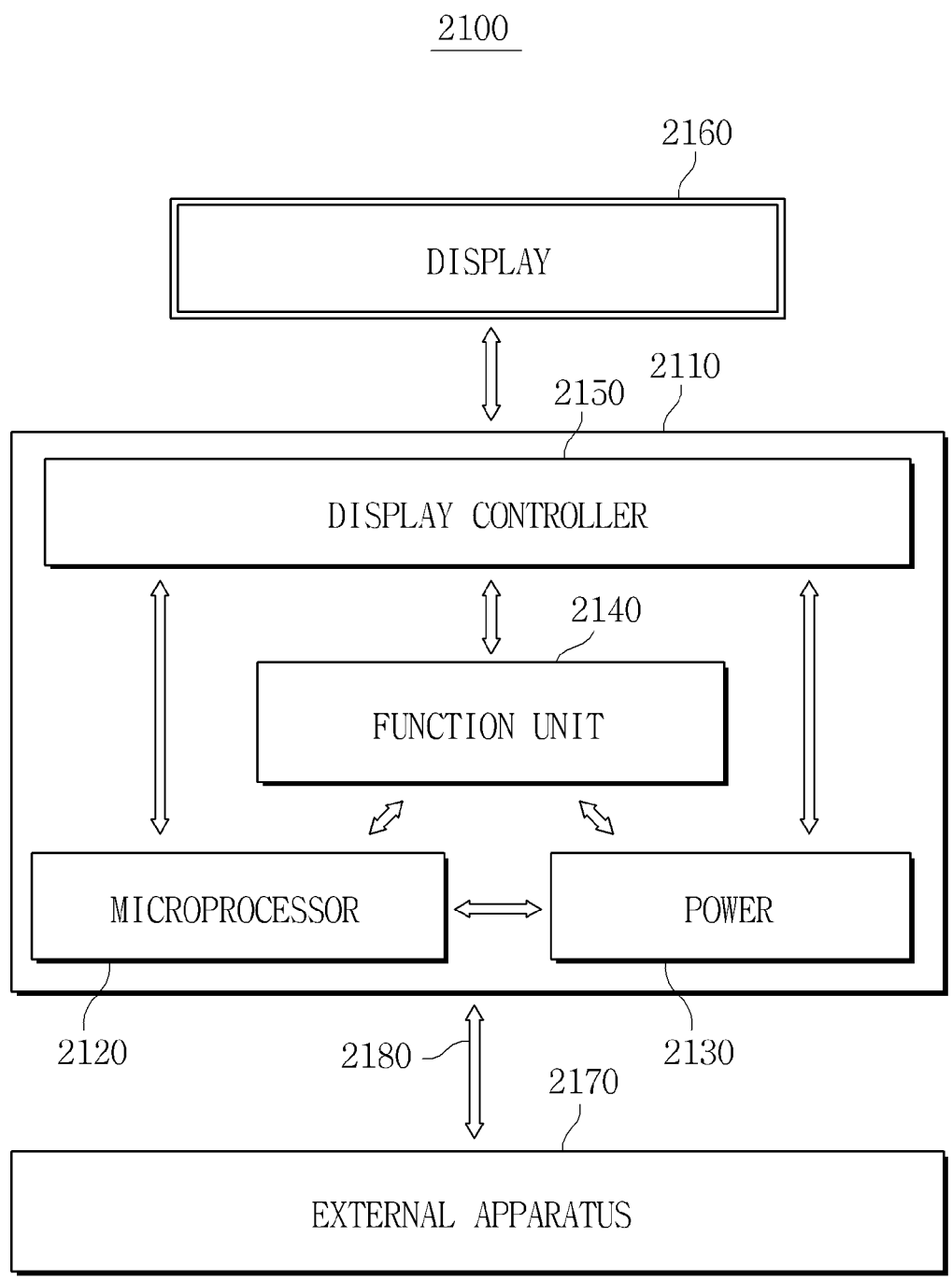
FIG. 34 is a block diagram of an electronic system employing a semiconductor package according to the inventive concept.

Applications of the inventive concept are shown in FIGS. 33 and 34.

Referring to FIG. 33, a semiconductor package and method of manufacturing the same as described in FIGS. 1 to 32 may be applied to an electronic system such as a mobile phone 1900, a net book, a note book, or a tablet PC. For example, a semiconductor package according to the inventive concept may be mounted on a main board of the mobile phone 1900. Furthermore, a semiconductor package according to the inventive concept may be in an auxiliary electronic device such as an external memory card of the mobile phone 1900.

The block diagram of FIG. 34 shows a general configuration of an electronic system 2100 that may employ a semiconductor package according to the inventive concept. The electronic system 2100 of this example includes a body 2110, a micro processor 2120, a power unit 2130, a function unit 2140, and a display controller 2150. The body 2110 may be a motherboard. The micro processor 2120, the power unit 2130, the function unit 2140, and the display controller 2150 are mounted on the body 2110. The electronic system 2100 may also include a display 2160 and a wired or wireless communication unit 2180. The display 2160 may be disposed inside or outside the body 2110 (as in the illustrated example). For example, the display 2160 may be disposed on a surface of the body 2110 to display an image from data processed by the display controller 2150.

The power unit 2130 may receive a constant voltage from an external battery (not shown) and may apply the voltage at certain levels to the micro processor 2120, the function unit 2140, the display controller 2150, etc. The micro processor 2120 controls the function unit 2140 and the display unit 2160. The function unit 2140 performs various functions of the electronic system 2100. For example, when the electronic system 2100 is a mobile phone, the function unit 2140 may include elements which perform such functions as voice output to a speaker of the phone, and image output to the display unit 2160. When the electronic system 2100 comprises a camera, the function unit 2140 may comprise the image processor of the camera. Furthermore, the electronic system 2100 may be of a type that is connectable to a memory card for expanding the memory capacity of the system. In this case, the function unit 2140 may be a memory card controller.

The electronic system 2100 may also be configured such that the function unit 2140 can transmit/receive signals to/from the external apparatus 2170 via the communication unit 2180. And, in the case in which the electronic system 2100 is provided with a universal serial bus (USB) that allows for the electronic system 2100 to perform additional functions, the function unit 2140 can serve as an interface controller. Furthermore, the function unit 2140 may include a mass storage device.

A semiconductor package, having the external terminals 5, according to the inventive concept may be employed by the function unit 2140. In this case, the external terminals 5 are connected to the body 2110. As a result, the electronic system 2100 can be light, thin, and compact.

As described above, a semiconductor package according to the inventive concept includes a substrate, a first semiconductor chip, a chip stack disposed on the first semiconductor chip, a first encapsulant encapsulating the first chip, and a second encapsulant encapsulating the chip stack. The semiconductor package can thus be relative thin and compact without compromising the integrity of the mounted chips. Also, the first semiconductor chip, by which the semiconductor chips of the chip stack can transmit data to and receive data from external apparatus, is mounted closest to the substrate. Therefore, a critical path along which signals are transmitted in the semiconductor package is minimized, which allows the package to operate at high speeds. Furthermore, the semiconductor package can be mass produced efficiently and at a high yield.

Finally, the inventive concept and examples thereof have been described above in detail. The inventive concept may, however, be embodied in many different forms and should not be construed as being limited to the examples described above. Rather, these embodiments and examples were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor package comprising:
a substrate having upper and lower surfaces;
a first semiconductor chip disposed on the upper surface of the substrate;
a first encapsulant disposed in contact with the upper surface of the substrate and in which the first semiconductor chip is embedded;
a plurality of second semiconductor chips stacked vertically one atop the other on the first encapsulant; and
a second encapsulant disposed in contact with the upper surface of the substrate and in which the stack of second semiconductor chips is embedded, and
wherein the first encapsulant has first and second sidewall surfaces facing in opposite directions, and third and fourth sidewall surfaces facing in opposite directions, and the third sidewall surface of the first encapsulant joins and subtends an angle with the first sidewall surface of the first encapsulant,
the first sidewall surface stands upright on the upper surface of the substrate at a location spaced inwardly from an outer periphery of the substrate,
the first encapsulant is embedded in the second encapsulant with the second encapsulant covering the first sidewall surface of the first encapsulant, and
the third sidewall surface of the first encapsulant is exposed at an exterior of the package.

2. The semiconductor package of claim 1, wherein a sidewall surface of the substrate, the third sidewall surface of the first encapsulant and a sidewall surface of the second encapsulant are coplanar.

3. The semiconductor package of claim 1, wherein the second sidewall surface of the first encapsulant stands upright on the upper surface of the substrate at a location spaced inwardly from the outer periphery of the substrate, the second encapsulant covers the second sidewall surface of the first encapsulant, and the fourth sidewall surface of the first encapsulant is exposed at the exterior of the package.

4. The semiconductor package of claim 1, wherein a sidewall surface of the substrate that delimits the outer periphery of the substrate is exposed at the exterior of the package.

5. The semiconductor package of claim 1, wherein the first and second encapsulants comprise a molding compound.

6. The semiconductor package of claim 1, wherein a dimension of each of the second semiconductor chips in a direction perpendicular to the first sidewall surface of the first encapsulant is greater than a dimension of the first semiconductor chip in said direction.

7. The semiconductor package of claim 1, wherein the first semiconductor chip is a logic chip, and the second semiconductor chips constitute a NAND flash memory.

8. The semiconductor package of claim 1, further comprising a buffer chip disposed adjacent to the first semiconductor chip, the buffer chip comprising a random access memory.

9. The semiconductor package of claim 8, wherein the buffer chip is disposed between the substrate and the first semiconductor chip, between the first semiconductor chip and the first encapsulant, or between the substrate and the first encapsulant.

10. The semiconductor package of claim 1, further comprising a decoupling capacitor disposed on the substrate.

11. The semiconductor package of claim 1, wherein each of the second semiconductor chips is offset horizontally relative to the semiconductor chip on which it is disposed such that each of the second semiconductor chips exposes part of the upper surface of the semiconductor chip on which it is disposed.

12. A semiconductor package comprising:
a substrate having upper and lower surfaces, and a first bond finger, a second bond finger and a third bond finger disposed at and spaced from one another along the upper surface of the substrate;
a first semiconductor chip disposed on the upper surface of and mounted to the substrate;
a first conductive connection extending between and electrically connecting the first bond finger and the first semiconductor chip;
a first encapsulant encapsulating the first semiconductor chip and the first conductive connection on the substrate;
a lower chip stack disposed on the first encapsulant and including a plurality of second semiconductor chips;
an upper chip stack disposed on the lower chip stack and including a plurality of third semiconductor chips;
a second conductive connection extending directly between and electrically connecting the second bond finger and one of the second semiconductor chips of lower chip stack;
a third conductive connection extending directly between and electrically connecting the third bond finger and one of the third semiconductor chips of the upper chip stack; and
a second encapsulant covering the first encapsulant, the lower chip stack, the upper chip stack, the second conductive connection and the third conductive connection, and
wherein the sum of the distance between the first and second bond fingers and the length of the second conductive connection is substantially the same as the sum of the distance between the first and third bond fingers and the length of the third conductive connection.

13. The semiconductor package of claim 12, wherein the distance between the first and second bond fingers is the same as or greater than the distance between the first and third bond fingers.

14. The semiconductor package of claim 12, wherein the semiconductor chips of the lower chip stack form a cascading structure in which each of the second semiconductor chips are horizontally offset in a first direction relative to each second semiconductor chip on which it is disposed, the semiconductor chips of the upper chip stack form a cascading structure in which each of the third semiconductor chips is horizontally offset in a second direction different from the first direction relative to each of the third semiconductor chips on which it is disposed, the second semiconductor chips are electrically connected to one another in series, and the third semiconductor chips are electrically connected to one another in series.

15. The semiconductor package of claim 12, wherein the second semiconductor chips are electrically connected to the first conductive connection via the second bond finger, and the third semiconductor chips are electrically connected to the first conductive connection via the third bond finger.

16. A semiconductor package comprising:

a circuit board having upper and lower surfaces;

a first semiconductor chip disposed on the upper surface of and electrically connected to the circuit board;

a first encapsulant molded to the circuit board and in which the first semiconductor chip is embedded such that the first semiconductor chip is encapsulated by the first encapsulant on the upper surface of the circuit board;

second semiconductor chips disposed on the upper surface of the circuit board, the second semiconductor chips stacked vertically one atop the other on the first encapsulant, and electrically connected to the circuit board independently of the first semiconductor chip; and a second encapsulant molded to the circuit board and in which the stack of second semiconductor chips is embedded such that the stack of second semiconductor chips is encapsulated by the second encapsulant on the upper surface of the circuit board, and wherein the first encapsulant has first and second sidewall surfaces facing in opposite directions and standing upright on the upper surface of the circuit board at respective locations disposed inwardly of an outer periphery of the circuit board, and third and fourth sidewall surfaces facing in opposite directions, the first encapsulant is embedded in the second encapsulant with the first and second sidewall surfaces of the first encapsulant covered by the second encapsulant, the third and fourth sidewall surfaces of the first encapsulant are exposed at an exterior of the package, and each of the second chips has a larger dimension, in a given horizontal direction parallel to the upper surface of the circuit board, than the first semiconductor chip.

17. The semiconductor package of claim 16, wherein the first semiconductor chip is a logic chip, and each of the second semiconductor chips is a memory chip.

18. The semiconductor package of claim 16, wherein the second encapsulant has sidewall surfaces that face in opposite directions, one of the sidewall surfaces of the second encapsulant, one of the third and fourth sidewall surfaces of the first encapsulant, and a sidewall surface of the circuit board are coplanar, and the other of the sidewall surfaces of the second encapsulant, the other of the third and fourth sidewall surfaces of the first encapsulant, and another sidewall surface of the circuit board are coplanar.

19. The semiconductor package of claim 16, wherein the first encapsulant has first and second sidewall surfaces facing in opposite directions, and third and fourth sidewall surfaces facing in opposite directions, and the lowermost one of the second chips protrudes horizontally beyond the location of the first sidewall surface of the first encapsulant.

* * * * *